United States Patent [19]

Noshiro et al.

[11] Patent Number: 5,248,663

[45] Date of Patent: Sep. 28, 1993

[54] METHOD OF FORMING OXIDE SUPERCONDUCTOR PATTERNS

[75] Inventors: Hideyuki Noshiro; Seigen Otani, both of Kawasaki, Japan

[73] Assignee: Fujitsu Limited, Kawasaki, Japan

[21] Appl. No.: 850,828

[22] Filed: Mar. 13, 1992

[30] Foreign Application Priority Data

Mar. 14, 1991 [JP] Japan .................................. 3-048563

[51] Int. Cl.⁵ .............................................. B05D 5/12
[52] U.S. Cl. ........................................ 505/1; 505/701; 505/702; 505/706; 505/730; 427/62; 427/63; 427/309; 156/654; 156/659.1; 156/667
[58] Field of Search .................. 505/1, 701, 702, 706, 505/730; 427/62, 63, 309; 156/654, 659.1, 667

[56] References Cited

U.S. PATENT DOCUMENTS 5,071,832 12/1991 Iwamatsu ................................. 505/1

*Primary Examiner*—Roy King
*Attorney, Agent, or Firm*—Staas & Halsey

[57] ABSTRACT

A method of forming a superconductor pattern in which at lest a pair of electrodes is formed on a substrate in spaced, facing relationship nd an oxide superconductor thin film having a unit lattice which assumes a laminar structure then is formed on the substrate, extending between and contacting the electrodes. The superconductor pattern obtained by this method suffers less degradation of the superconductor thin film, in comparison with that of patterns formed by the prior art methods, and the decrease of the critical current density as a function of increasing temperature is extremely small.

5 Claims, 8 Drawing Sheets

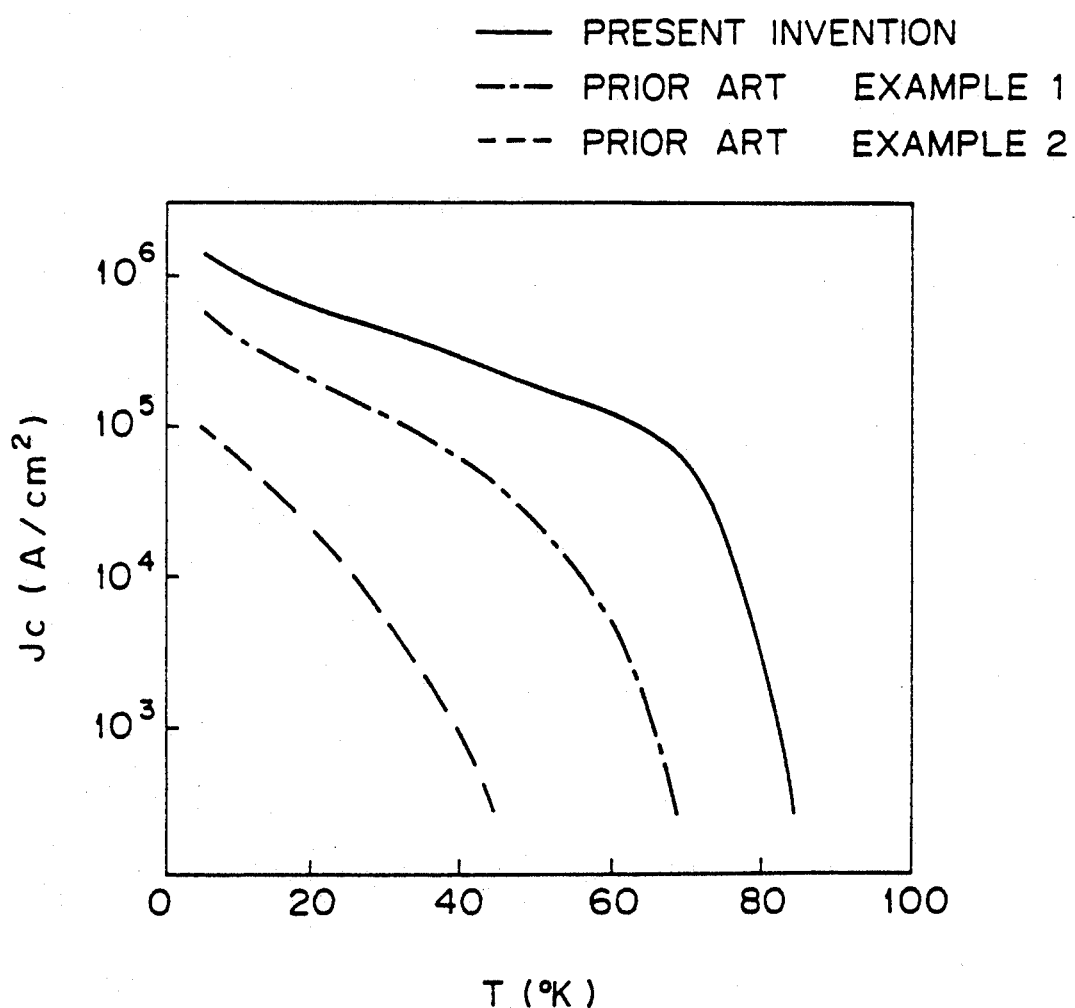

METHOD OF FORMING OXIDE SUPERCONDUCTOR PATTERNS

BACKGROUND OF THE INVENTION

1. Field of the Invention

This invention relates to a method of forming a superconductor pattern. More particularly, the present invention relates to a method of forming a superconductor pattern without lowering a critical current density.

2. Description of the Related Art

It has long been known that many metals and inorganic compounds such as molybdenum carbide (MoC), niobium germanium ($Nb_3Ge$), etc., exhibit a superconductivity at ultra-low temperatures, but the superconduction transition point (Tc) of these inorganic compounds is low, and is at most 10K for metals and 23.5K for $Nb_3Ge$.

The discovery of high temperature superconduction of oxide ceramics of lanthanum-barium-copper-oxygen (La—Ba—Cu—O) system, in 1986, led to intensive studies into and the development of high temperature superconductive ceramics having a critical temperature Tc above the boiling point (77.2K) of liquid nitrogen ($N_2$), such as a Bi system consisting of bismuth-strontium-ca-cium-copper-oxygen (Bi—Sr—Ca—Cu'O), a Y system consisting of yttrium-barium-copper-oxygen (Y—Ba—Cu—O), and a Tl system consisting of thallium-barium-calcium-copper-oxygen (Tl—Ba—Ca—Cu—O), etc.

Semiconductor devices constituting the principal portion of data processing units are made of simple substance semiconductors, typified by silicon (Si), or compound semiconductors typified by gallium arsenide (GaAs), due to the necessity for quickly processing large quantities of data, and integrated circuitry such as ICs and LSIs are in practical application.

A conductor pattern consisting the integrated circuit is formed by depositing a thin metal film, such as of gold (Au), aluminum (Al), etc., on a semiconductor, substrate (wafer), and forming a fine pattern thereof by photolithography, according to the prior art.

Data processing, however, could be made at a far higher speed and a much lower loss than in the prior art if a high temperature superconductor were to be used, in place of a metal, as the material of the conductor pattern, and the transmission of signals effected by utilizing superconduction and employing liquid nitrogen ($N_2$) as a cooling medium.

Various oxide superconductors are known, as described above, and in all of such superconductors, oxides assuming a two-dimensional structure are laminated to form a unit lattice, and the repetition of this structure forms a superconductor thin film having a predetermined thickness.

It is customary to use a material having a low reactivity with the superconductor, such as magnesia (MgO), strontium titanate ($SrTiO_3$), etc., as a substrate, and to grow a superconductor thin film by vacuum deposition, sputtering, chemical vapor deposition (CVD), molecular beam epitaxy (MBE), or the like.

The following explanation relates to the case wherein the film of a Bi system superconductor is formed by vacuum deposition on a MgO substrate. The MgO substrate is first positioned in an ion plating apparatus and, while the substrate is heated, the interior of a deposition chamber of the apparatus is maintained in an oxygen ($O_2$) atmosphere of about $1 \times 10^{-4}$ Torr. Power is then supplied to a radio frequency coil and while an oxygen (O) plasma is generated in a discharge region, a vacuum deposition of Bi, Sr, Cu, Ca, Cu, Sr and Bi is sequentially carried out, in that order. Thereafter, the reactive vacuum deposition is effected and the deposited metal atoms are oxidized, whereby these oxides are built up and provide an oxide superconductor thin film.

FIG. 7 shows the lattice structure of the Bi system superconductor formed in this manner. The lattice is oriented with the C axis directed upward, perovskite layers of a ½lattice exist vertically through $(BiO)_2$ layers, and the BiO layers are weakly bonded to one another by the van der Waals force. Therefore, a cleavage of the superconductor occurs at this position, and due to the existence of this cleavage, the electric conductivity in the longitudinal direction (C-axis direction) becomes low.

Next, to form a conductor pattern by patterning the resulting superconductor thin film, electrodes must be formed at both ends of the pattern.

A conventional method of forming a superconductor pattern comprises patterning a superconductor thin film 2 (FIG. 2B) on a substrate 1 (FIG. 2A), forming electrodes 3 on respective, opposite end portions of this superconductor thin film 2, and forming a superconductor pattern (FIGS. 2A to 2C), as shown in FIG. 2. In the conventional superconductor pattern (hereinafter referred to as the "Prior Art Example 1") formed in this manner, however, when an voltage is applied to the electrodes 3, a current flows mainly along the surface of the superconductor thin film 2, but part of this current enters the inside thereof. Since electric resistance is high, however, the characteristics of the superconductor are lowered and the critical current density drops (see FIG. 4).

Another conventional method comprises forming a superconductor thin film 12 on a substrate 1 (FIGS. 3A and 3B), patterning this thin film 12 by photolithography, and forming electrodes 13 at both end portions of the thin film 13, as shown in FIG. 3C (hereinafter referred to as the "Prior Art Example 2"). This method, however, has a problem in that the film quality is deteriorated during the etching step, and thus the critical current density of the superconductor drops (see FIG. 4).

To form a conductor pattern by patterning a superconductor thin film, electrodes must be formed at both ends of this pattern, but the superconductor has a laminar structure and the electrical conductivity in the c axis thereof is lower than in the a and b axes. Accordingly, the conventional methods of forming the electrodes cannot pass a current having a uniform current density through the section of the film, and this causes the drop of the critical current density.

SUMMARY OF THE INVENTION

The present invention is intended to eliminate the problems of the prior art, and to accomplish this, the present invention includes at least the steps of forming a pair of electrodes on a substrate, in such a manner that they face each other, and selectively forming an oxide superconductor thin film having a unit lattice which assumes a laminate structure, between these electrodes.

When the invention is constituted as described above, the resulting superconductor pattern suffers less degradation of the superconductor thin film, as described later, than the superconductor pattern obtained by the conventional method, and can advantageously prevent the drop of the critical current density (Jc).

BRIEF DESCRIPTION OF THE DRAWINGS

The object and advantages of the present invention will become more apparent from the following description of a preferred embodiment of the invention, taken in conjunction with the accompanying drawings, in which:

FIG. 4 is a diagram showing the temperature dependence of a critical current density;

DESCRIPTION OF THE PREFERRED EMBODIMENTS

Unlike the prior art methods, the method of the present invention first forms a pair of electrodes on a substrate and then forms a superconductor thin film between the electrodes, as already described.

In a preferred embodiment of the present invention, a recess is first formed in a conductor pattern formation region of a substrate, at least a pair of electrodes are formed at respective, opposite ends of the recess, so that they face each other and, thereafter, an oxide superconductor thin film is formed between the electrodes.

The formation of the oxide superconductor thin film is carried out by vacuum deposition, sputtering, chemical vapor deposition (CVD), molecular beam epitaxy (MBE), and so forth; preferably, by vacuum deposition.

In the method of the present invention, preferably a crystalline substrate having a (100) plane as the substrate surface is used. Examples of the materials for such a substrate are magnesia (MgO) and strontium titanate ($SrTiO_3$).

Preferably, a Bi system consisting of Bi—Sr—Ca—Cu—O or a Tl system consisting of Tl—Ba—Ca—Cu—O is formed as the superconductor thin film.

The oxide superconductor thin films assume a laminar structure and form a unit lattice, and the Bi system and the Tl system in particular have a remakable laminar structure.

When the film is grown on the substrate of MgO or $SrTiO_3$ by vacuum deposition, the film is formed with the c axis always oriented in a direction vertical to the substrate, if the (100) plane is used as the substrate surface.

Therefore, according to the present invention, the substrate using the (100) plane as the substrate surface is cut so as to define a recess, electrodes are then formed at both end portions of this recess, and the superconductor thin film is patterned by lift-off, and thus the problems of the prior art can be advantageously solved.

Since the etching step does not exist, a degradation of the superconductor thin film does not occur and further, since the c axis of the superconductor vertically faces the substrate and since the section of the superconductor thin film is in contact with the electrodes at right angles, a current is allowed to flow uniformly inside the thin film; accordingly, the drop of the critical current density can be prevented.

Although the present invention will be hereinafter explained in further detail with reference to the embodiments thereof, the present invention is not limited thereto.

EMBODIMENT

Example 1

FIGS. 1A to 1F are schematic sectional news of successive the steps of an embodiment of the method of the present invention.

Figure 1A:
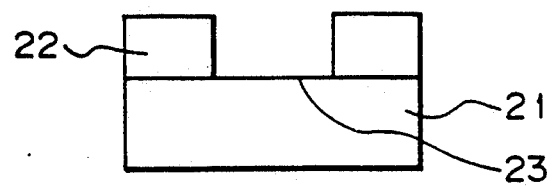
FIGS. 1A, 1B, 1C, 1D, 1E and 1F are a schematic sectional views of successive steps of an embodiment of the method of the present invention.

A positive resist 22 (novolak resin type resist, "OFPR") was spun-coated to a thickness of 1 μm on a MgO substrate 21, using the (100) plane thereof as the substrate surface, and after a selective exposure, an alkali development was effected and windows were opened in a conductor pattern formation region 23 (FIG. 1A).

Figure 1B:
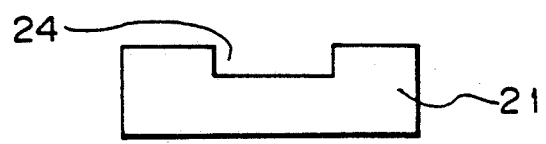

Next, this substrate 21 was placed in a sputtering apparatus, and evacuation was carried out while argon (Ar) gas was being supplied. The sputter-etching was carried out while the inside of the apparatus was kept at 10 m Torr, to thereby define a recess 24 having a depth of 2000 Å, and then substrate was dipped into a peeling solution to dissolve and remove the resist (FIG. 1B).

Figure 1C:
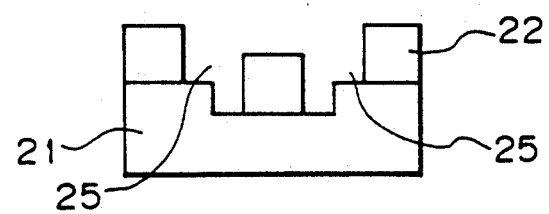

Next, the same resist 22 as described above was coated onto the substrate 21, and after a selective exposure, a development thereof was carried out to open windows at electrode formation positions 25 (FIG. 1C).

Figure 1D:
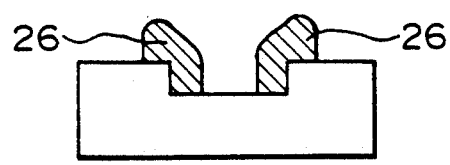

Then gold (Au) was deposited to a thickness of 2000 Å by vacuum deposition, and after the resist 22 was dissolved and removed, electrodes 26 made of Au were formed (FIG. 1D).

Figure 1E:
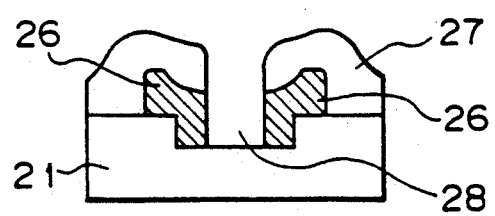

A resist 27 was coated onto the substrate 21 and the electrodes 26, and a selective exposure by UV beam was effected to open windows in the conductor pattern formation region 28 (FIG. 1E).

The substrate 21 was placed in a reactive vacuum deposition apparatus and heated to 200° C., and while the substrate 21 was being heated, a reactive vacuum deposition of Bi, Sr, Cu, Ca, Sr and Bi was sequentially carried out, in that order, to form the conductor pattern formation region 28 and a superconductor thin film 29.

Figure 1F:
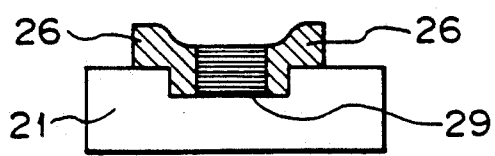

Subsequently, the resist 27 was dissolved and removed, and the conductor pattern was formed between the electrodes 26 (FIG. 1F).

Finally, the resulting substrate was heated to 500° C. in an $O_2$ atmosphere, and a superconductor pattern exhibiting superconductor characteristics was completed.

Figure 5:
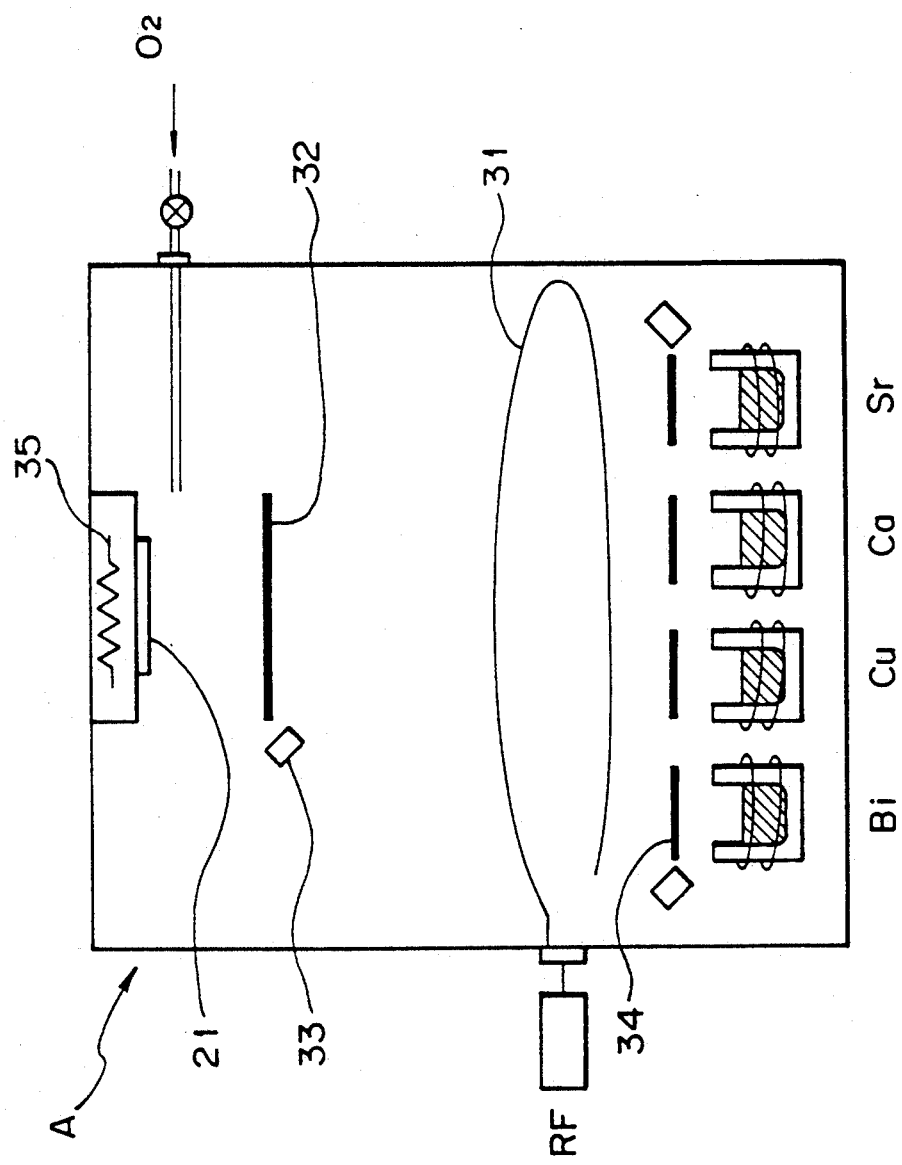
FIG. 5 is a schematic view of an example of a reactive vacuum deposition apparatus used for the method of the present invention.

Note, the growth of the Bi system superconductor thin film was carried out in more detail by the use of a reactive vacuum deposition apparatus A shown in FIG. 5. In this apparatus, an oxygen gas was introduced near to the substrate 21 (see FIG. 5) and a radio frequency (RF) voltage was applied to a ring 31 made of a metal so as to generate oxygen plasma. A shutter 32 and a quartz monitor 33 for monitoring the film thickness were disposed near the substrate. Each of the Bi, Sr, Ca and Cu materials was heated and evaporated by a resistance heating system and the vacuum deposition quantity thereof was controlled by the shutter 34.

The growth of the thin film was carried out as follows. The substrate was heated to 200° C. by the heater 35, the oxygen pressure was set to $1 \times 10^{-4}$ Torr and the RF power was set to 120 W. Bi, Sr, Ca and Cu were heated to 520° C., 430° C., 600° C. and 1,080° C., respectively, and each of the elements was evaporated for 30 seconds in the sequence Bi/Sr/Cu/Ca/Cu/Sr/Bi; this cycle was repeated 200 times.

The solid line in FIG. 4 represents critical current characteristics of the superconductor pattern thus formed. As can be clearly seen from this result, the method of the present invention can suppress the drop of the critical current density (Jc) in a magnetic field because a degradation of the superconductor thin film does not occur, in comparison with the prior art method.

Although this embodiment used MgO as the substrate, the same result can be obtained when the (100) plane of $SrTiO_3$ is used.

Similarly, the same effect can be obtained by the use of the Tl system in place of the Bi system, as the oxide superconductor.

Example 2

This example represents the case where the method of the present invention was applied to a device, and will be explained with reference to FIGS. 6A to 6K.

Figure 6A:
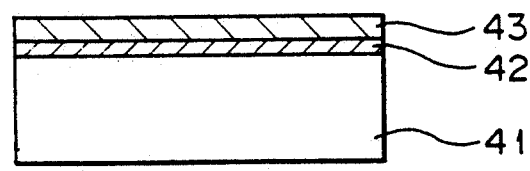
FIGS. 6A, 6B, 6C, 6D, 6E, 6F, 6G, 6H, 6I, 6J and 6K are schematic views of successive steps of an example of the application of the present method to a practical device.

A silicon dioxide film (500 Å) 42 was formed on a silicon substrate 41 by thermal oxidization (1000° C., $O_2$) and then a $Si_3N_4$ film (1000 Å) 43 was deposited on the $SiO_2$ film by CVD ($SiH_4+NH_3$, 800° C.) (FIG. 6A).

Figure 6B:
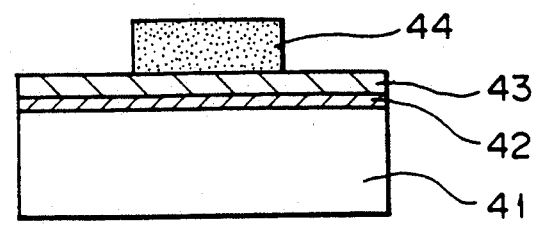

Patterning was then carried out to form each, of the gate, drain and source electrodes. (A resist 44 was 8000 Å thick and was a novolak type resin. Hereinafter the patterning conditions were the same) (FIG. 6B).

Figure 6C:
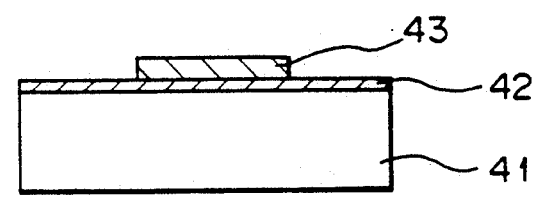
Figure 6D:
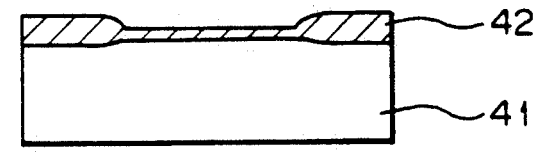

The $Si_3N_4$ film 43 was wet-etched using phosphoric acid, to remove the resist, and further, the entire surface was oxidized by thermal oxidation (950° C., $O_2$) $Si_3N_4$ was then removed by wet-etching using phosphoric acid (FIGS. 6C-6D).

Figure 6E:
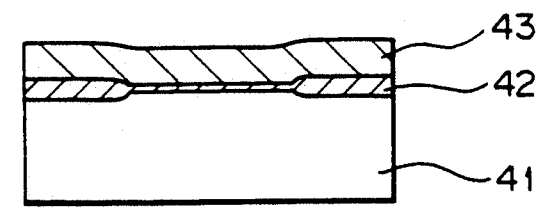

Polycrystalline silicon (Poly-Si) 43 was deposited to a thickness of 4000 Å by CVD ($SiH_4$, 500° C.) (FIG. 6E).

Figure 6F:
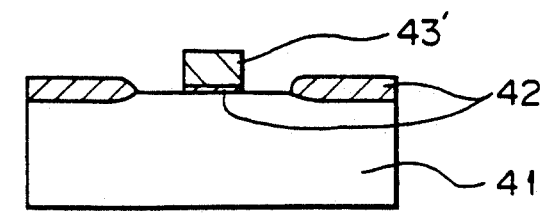

Poly-Si 43 was patterned and the gate electrode 43' was formed (FIG. 6F).

Figure 6G:
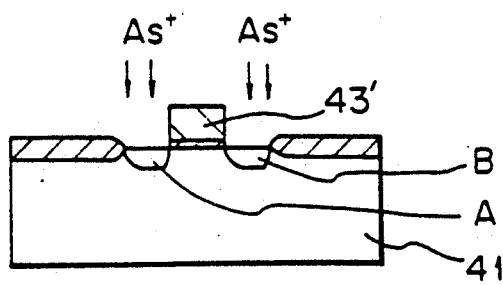

Arsenic ions ($As^+$) were inplanted into the source region A and unto the drain region B by ion implantation (acceleration voltage 60 KeV, dose $5 \times 10^{15}$ cm$^{-2}$) (FIG. 6G).

Figure 6H:
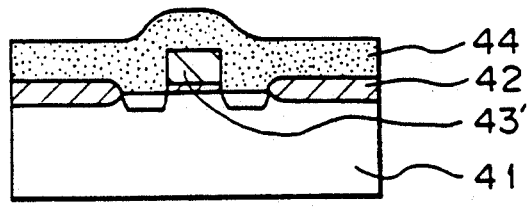

A PSG film 44 was deposited to a thickness of 8000 Å by CVD ($SiH_4+PH_3+O_2$, 300° C.) (FIG. 6H).

Figure 6I:
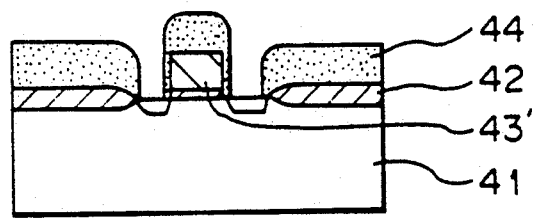

The source and drain electrode portions were wet-etched. (PSG was wet-etched by phosphoric acid+nitric acid+hydrofluoric acid) (FIG. 6I)

Figure 6J:
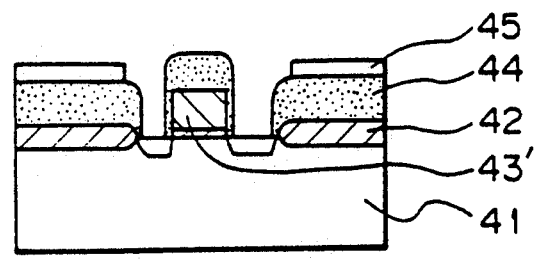

An $SrTiO_3$ film was grown to a thickness of 1 μm using a reactive vacuum deposition apparatus, to form an SrTiO: film 45 (Sr metal, Ti metal, 500° C.) (FIG. 6J).

Figure 6K:
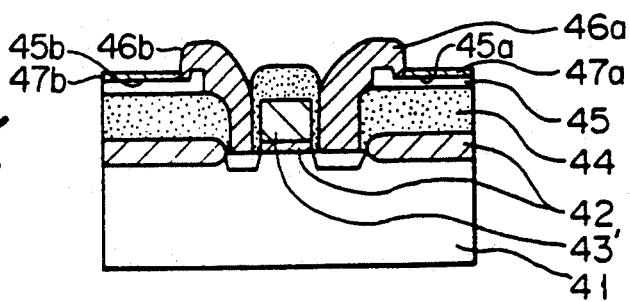
Figure 7:
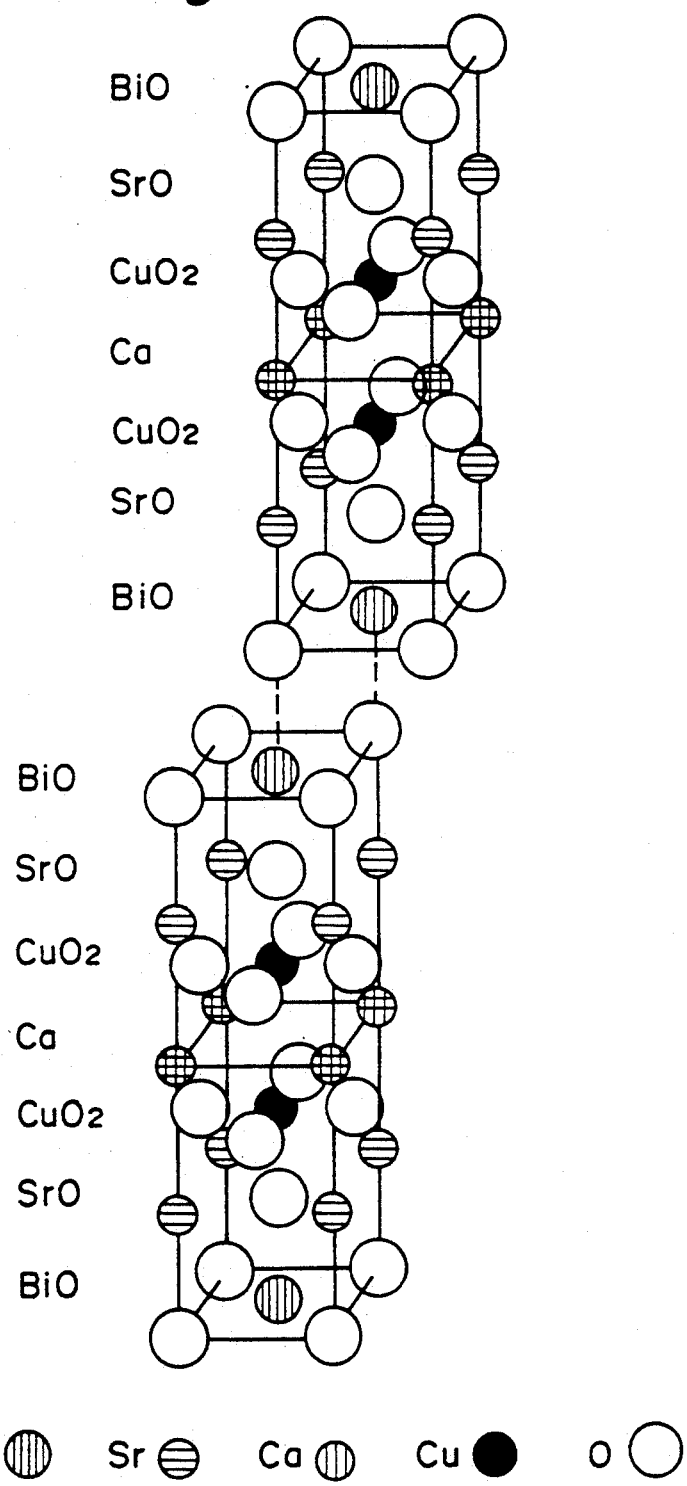
FIG. 7 is a schematic view showing a crystal structure of $Bi_2Sr_2CaCu_2O_x$.

Thereafter, the procedures of Example 1 were repeated, and the superconductor pattern having the Bi system superconductor film pattern portions 47a and 47b were formed between each of the corresponding Al electrodes 46a and 46b and respective such electrodes (not shown) spaced therefrom (FIG. 6K). More specifically, FIG. 6K illustrates two superconductor film patterns 47a and 47b extending in opposite directions (ie., to the right and to the left, respectively in FIG. 6) from the centrally located device. IN accordance with Example 1, recesses 45a and 45b, respectively corresponding to the superconductor film pattern portions 47a and 47b, are first formed in the underlying layer 45 and after which the respectively corresponding electrodes 46a and 46b are formed, extending into corresponding end portions of the respective a recesses 45a and 45b, followed by the formation of the corresponding superconductor film pattern portions 47a and 47b. Although not shown in FIG. 6K, the respective spaced electrodes (not shown) extending into the opposite ends of the respective recesses 45a and 45b would be similarly constructed, as shown in FIGS. 1D-1F.

The superconductivity of the superconductor pattern by the method of the present invention was then confirmed, i.e., the Jc was measured by placing the substrate in a tank of liquid nitrogen, and as a result, a value of $Jc = 5 \times 10^3$ A/cm at 77K was obtained.

We claim:

1. A method of forming a superconductor pattern on a substrate, comprising:

defining a conductor pattern region on a main surface of a substrate, the region having at least a pair of opposite end portions and a central potion therebetween;

forming pair of electrodes respectively on the pair of opposite end portions of the pattern region and in spaced, facing relationship with the central portion of the pattern region therebetween;

forming an oxide superconductor film, of a material selected from the group consisting of Bi-containing and Tl-containing oxide superconductor materials and having a unit lattice which forms a laminar structure, on the central portion of the pattern region, by a lift-off technique, the film being patterned to have a pair of opposite end surfaces in physical and electrical contact with the pair of electrodes, respectively, the electrodes providing a connection for supplying electrical current to the superconductor film.

2. A method for forming a superconductor pattern as recited in claim 1, further comprising:

prior to forming the pair of electrodes, initially forming a recess in the main surface of the substrate corresponding to the conductor pattern region, the opposite end portions of the region being includes within and cat corresponding opposite ends of the recess; and forming the pair of electrodes within the respective, opposite end portions of the recess.

3. A method of forming a superconductor pattern according to claim 1, further comprising:

forming the oxide superconductor film by vacuum deposition.

4. A method of forming a superconductor pattern according to claim 1, further comprising:

employing the (100) plane of the substrate as the main surface thereof.

5. A method of forming a superconductor pattern according to claim 1, further comprising:

selecting the material of the substrate from the group consisting of magnesia and strontium titanate.

* * * * *

UNITED STATES PATENT AND TRADEMARK OFFICE
CERTIFICATE OF CORRECTION

PATENT NO. : 5,248,663

DATED : Sep. 28, 1993

INVENTOR(S) : NOSHIRO et al.

It is certified that error appears in the above-indentified patent and that said Letters Patent is hereby corrected as shown below:

On title page, item [56] Abstract:
      line 1, change "lest" to --least--;
      line 3, change "nd" to --and--.

Col. 1,   line 26, change "ca-cium" to --calcium--; and change "(Bi—Sr—Ca—Cu'O)" to --(Bi—Sr—Ca—Cu—O)--;
         line 40, after "semiconductor" delete ",".

Figure 2A:
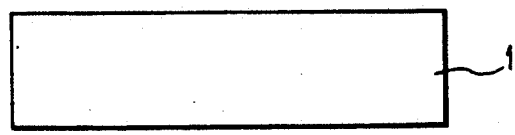
FIGS. 2A, 2B and 2C are a schematic sectional views of successive steps of an example of the prior art methods.
Figure 2B:
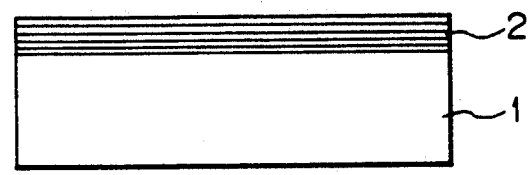
Figure 2C:
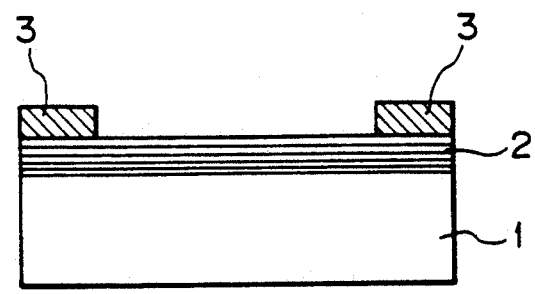
Figure 3A:
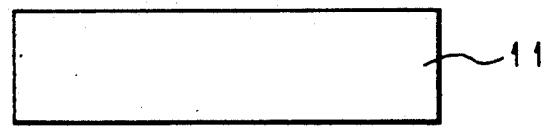
FIGS. 3A, 3B ad 3C are a schematic sectional views of successive steps of another example of the prior art methods.
Figure 3B:
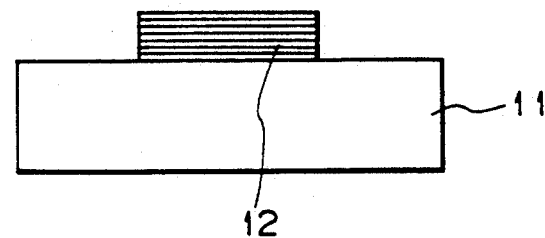
Figure 3C:
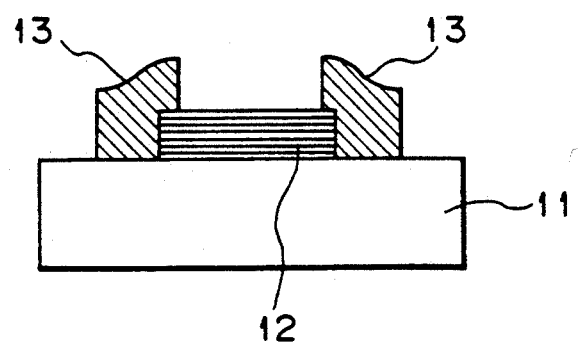

Col. 2,   line 1, after "and" insert --,--;
         line 26, change "(FIGS. 2A to 2C)" to --(FIG. 2C)--; and change "FIG. 2" to --FIGS. 2A to 2C--.

Col. 3,   line 10, after "are" delete "a";
         line 13, after "are" delete "a";
         line 16, change "ad" to --and--; and after "are" delete "a".

Col. 5,   line 36, after "each" delete ",".

Col. 6,   line 4, change "IN" to --In--;
         line 20, after "respective" delete "a";
         line 27, change "potion" to --portion--;
         line 29, after "forming" insert --a--;

UNITED STATES PATENT AND TRADEMARK OFFICE
CERTIFICATE OF CORRECTION

PATENT NO. : 5,248,663
DATED : Sep. 28, 1993
INVENTOR(S) : NOSHIRO et al.

It is certified that error appears in the above-indentified patent and that said Letters Patent is hereby corrected as shown below:

Col. 6, line 50, change "includes" to --included--;
line 51, change "cat" to --at--.

Signed and Sealed this

Twenty-sixth Day of July, 1994

Attest:

BRUCE LEHMAN

*Attesting Officer*   *Commissioner of Patents and Trademarks*